(12) United States Patent
Nagayoshi et al.

(10) Patent No.: US 6,839,798 B1
(45) Date of Patent: Jan. 4, 2005

(54) FLASH MEMORY CAPABLE OF STORING FREQUENTLY REWRITTEN DATA

(75) Inventors: Hironao Nagayoshi, Tokyo (JP); Shinichi Ishimoto, Tokyo (JP)

(73) Assignees: Renesas Technology Corp., Tokyo (JP); Mitsubishi Electric Semiconductor Application Engineering Corp., Tokyo (JP)

( * ) Notice: Subject to any disclaimer, the term of this patent is extended or adjusted under 35 U.S.C. 154(b) by 0 days.

(21) Appl. No.: 09/318,791

(22) Filed: May 26, 1999

(30) Foreign Application Priority Data

Dec. 14, 1998 (JP) .......................................... 10-355035

(51) Int. Cl.[7] .......................... G06F 12/06; G06F 12/16
(52) U.S. Cl. ....................................... 711/103; 711/156
(58) Field of Search ................................. 711/103, 156, 711/170, 171, 172, 173, 1; 714/6; 709/104, 105; 365/185.33

(56) References Cited

U.S. PATENT DOCUMENTS

| | | |
|---|---|---|
| 5,404,485 A | 4/1995 | Ban |
| 5,438,573 A | 8/1995 | Mangan et al. |
| 5,864,661 A * | 1/1999 | Ohara .......................... 714/142 |
| 5,926,826 A * | 7/1999 | Ninomiya et al. .......... 711/103 |
| 6,038,636 A * | 3/2000 | Brown, III et al. ......... 711/103 |

FOREIGN PATENT DOCUMENTS

| | | |
|---|---|---|
| CN | 1098526 A | 2/1995 |
| EP | 0 712 067 A2 | 5/1996 |
| JP | 6-332806 | 12/1994 |
| JP | 7-50558 | 2/1995 |
| WO | WO 97/12325 | 4/1997 |

* cited by examiner

Primary Examiner—B. James Peikari
(74) Attorney, Agent, or Firm—Burns, Doane, Swecker & Mathis, L.L.P.

(57) ABSTRACT

A flash memory includes an address information storage and a data write unit. The address information storage records address information about blank areas in a cluster consisting of a plurality of sectors. The data write unit writes, in response to a write request of data, data into at least one of the blank areas by referring to the address information about the blank areas. This makes it possible to solve a problem that occurs with a conventional flash memory. In particular, the number of erasable times of the improved flash memory is not limited to about one tenth of that of an EEPROM, and hence the improved flash memory can store frequently rewritten data.

12 Claims, 13 Drawing Sheets

FIG.9
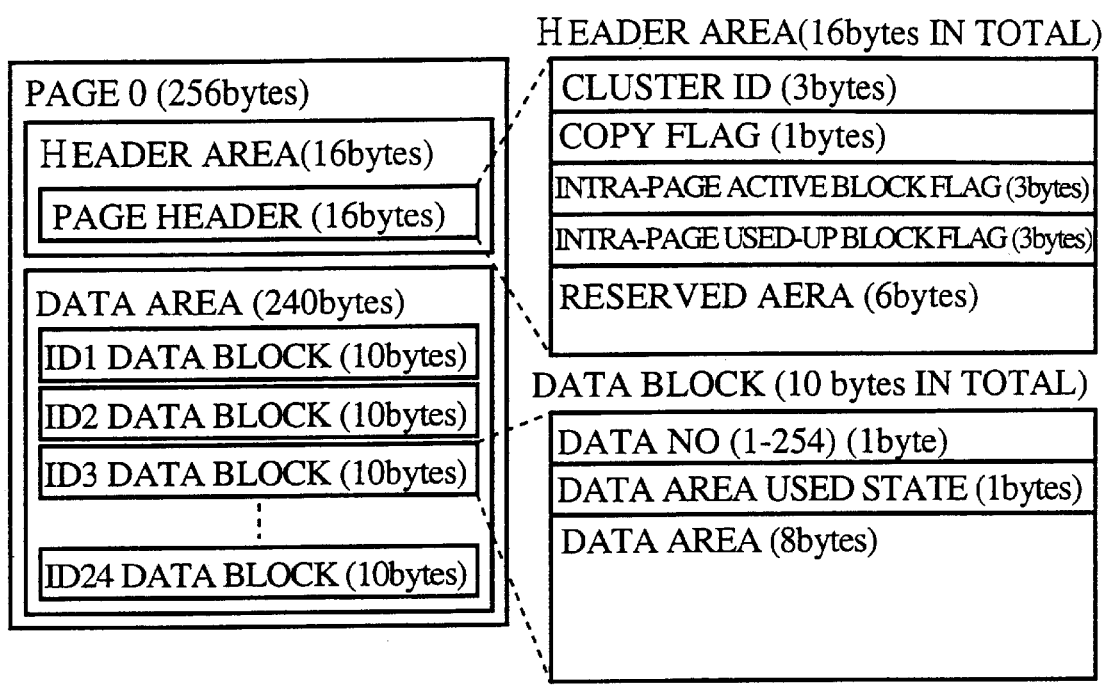
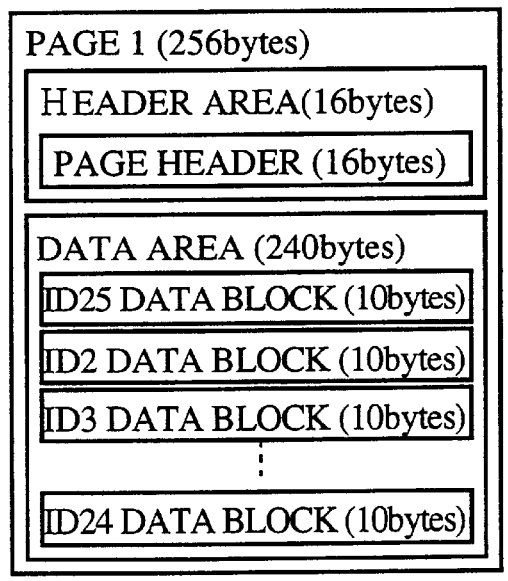
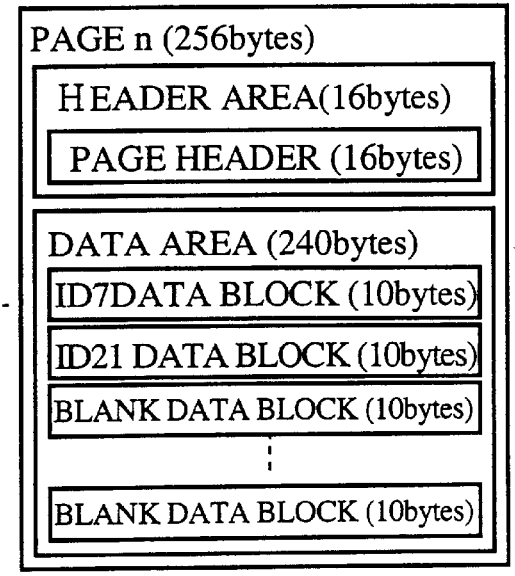

US 6,839,798 B1

FLASH MEMORY CAPABLE OF STORING FREQUENTLY REWRITTEN DATA

BACKGROUND OF THE INVENTION

1. Field of the Invention

The present invention relates to a flash memory such as a flash EEPROM (electrically erasable programmable read only memory) for recording nonvolatile data.

2. Description of Related Art

A built-in system such as a mobile phone today employs a random access flash memory for storing programs of the system, an EEPROM for recording frequently rewritten data and a rather small amount of nonvolatile data, and a serial write flash memory or an SRAM (static random access memory) with a backup power supply for recording a large amount of data.

The EEPROM, which requires a greater number of memory elements per bit than the flash memory, demands a higher cost per bit. The SRAM with a backup power supply also raises the cost because of the backup power supply. Thus, recording the data, which is stored separately in these memories, into the flash memory has an advantage of being able to reduce the packaging area and cost of the device.

A conventional flash memory in a built-in system cannot read a system program while writing another system program. In addition the conventional flash memory writes the system program using a special processing. Recently, however, a flash memory (referred to as a BGO (background operation) flash memory from now on) has emerged which can read data from an area of the memory while writing data to another area. This makes it possible to integrate the flash memory for storing data into the flash memory for storing the program.

As an example that stores data in a flash memory, Japanese patent publication No. 7-50558/1995 disclose a semiconductor disk as shown in FIG. 14.

This system employs a flash memory 4 as a semiconductor disk, and comprises a controller 1, a RAM 2, a bus controller 3 and an internal bus 5 for controlling the semiconductor disk. The flash memory 4, however, has a restriction that the EEPROM or SRAM does not have.

The restriction is that the flash memory 4 can write data only in a unidirectional manner either from 0 to 1, or from 1 to 0. Thus, to rewrite an area that is already written, the entire block, including that area, must be erased before writing data so that 0s or 1s are written throughout the block. This makes it difficult for the conventional flash memory to write on a byte by byte basis as in the EEPROM or SRAM.

With the foregoing structure, the conventional flash memory can rewrite data to a written area if the entire block, including that area, is erased. The number of erasable times of the flash memory, however, is about one tenth of that of the EEPROM, which makes it difficult to record frequently rewritten data.

SUMMARY OF THE INVENTION

The present invention is implemented to solve the foregoing problem. It is therefore an object of the present invention to provide a flash memory capable of handling frequently rewritten data.

According to the present invention, there is provided a flash memory comprising: address information storing means for storing address information about blank areas in a cluster consisting of a plurality of sectors; data write means for writing, in response to a write request of data, the data into at least one of the blank areas referring to the address information about blank areas; and address information update means for updating, after the data write means completes writing of the data, the address information associated with the at least one of the blank areas to which the data is written.

Here, the data write means may write the data, when the cluster does not include any blank area, into another unused cluster, and may carry out flash erasing of the cluster without any blank area.

The data write means may validate a copy flag of the cluster without any blank area when writing the data into the another unused cluster.

The flash memory may further comprise at least one unused cluster besides clusters which an application can use.

The data write means may write data, if a write error takes place during writing data into the blank area of the cluster or into the another unused cluster, into still another cluster, and may carry out flash erasing of the cluster in which the write error takes place.

The flash memory may further comprise two or more unused clusters besides clusters which an application can use.

The flash memory may further comprise ID management means for registering a unique ID for each of the clusters which an application uses, and for registering IDs for unused clusters indicating that the unused clusters are available.

The ID management means may register, if a write error of the data takes place, an ID indicating that the cluster in which the write error takes place is unwritable.

The flash memory may further comprise three or more ID recording areas for recording a same ID in a header of each cluster.

The address information storing means may comprise, in a header of each cluster, a bit table for indicating a used state of a memory, such as the address information about the blank areas.

The data write means may write the data immediately after previously written data without a space therebetween.

Each of the sectors may include a plurality of data blocks, and the data write means may write the data into a blank area of one of the data blocks referring to a used state flag which is recorded in a header of each of the sectors for indicating a used state of the data blocks.

The data write means may write the data, when one of the data blocks does not include any blank area, into a blank area of another data block.

The flash memory may further comprise pointer creating means for creating, in a volatile memory, pointers for indicating locations of the data blocks storing the data.

BRIEF DESCRIPTION OF THE DRAWINGS

FIG. 9 is a diagram illustrating an internal data structure in an application;

DETAILED DESCRIPTION OF THE PREFERRED EMBODIMENTS

The invention will now be described with reference to the accompanying drawings.

Embodiment 1

Figure 1:
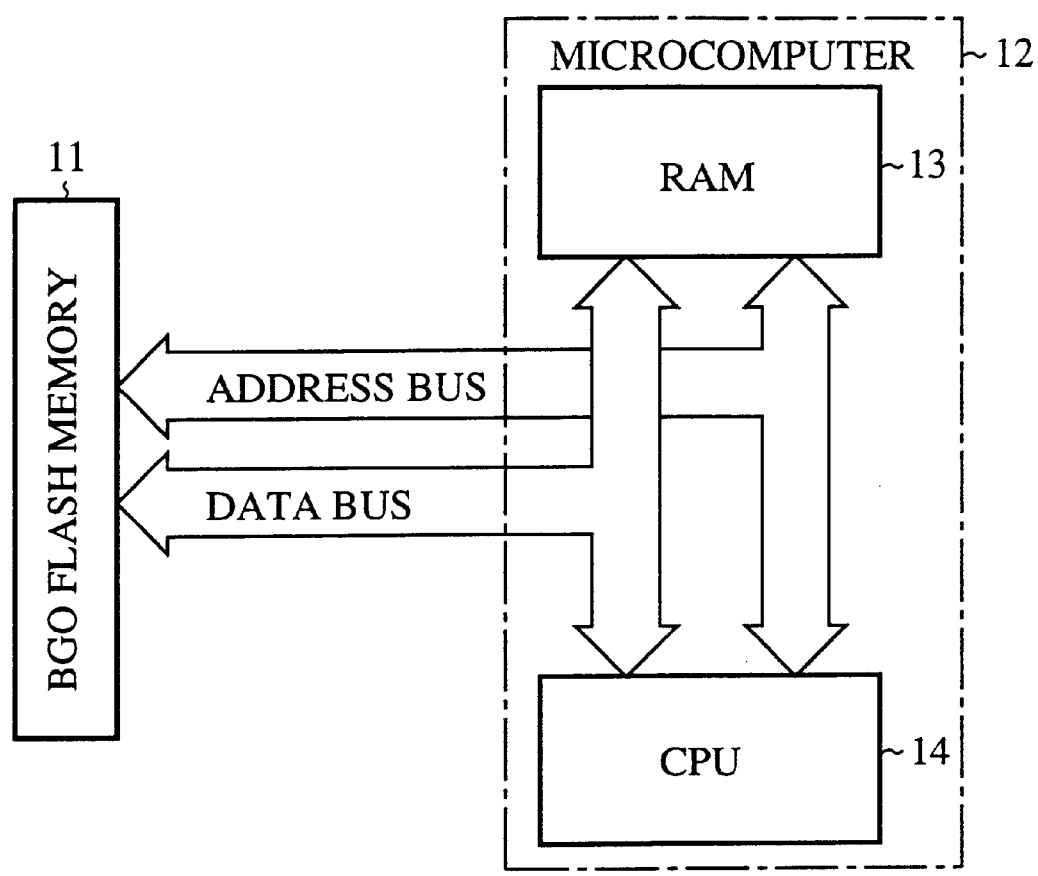
FIG. 1 is a block diagram showing an embodiment 1 of a flash memory in accordance with the present invention.

FIG. 1 is a block diagram showing an embodiment 1 of a flash memory in accordance with the present invention. In FIG. 1, the reference numeral 11 designates a BGO (background operation) flash memory consisting of clusters, each of which includes a plurality of sectors. The BGO flash memory 11 stores in its first sector address information about blank areas. As described before, the BGO flash memory 11 can read data from an area of the memory while writing data to another area. The reference numeral 12 designates a microcomputer for controlling the BGO flash memory 11; 13 designates a RAM of the microcomputer 12; and 14 designates a CPU of the microcomputer 12. The CPU 14 serves as a) an address information storing means for storing, in the first sector of each cluster, the address information about the blank areas; b) a data write means for writing data into the blank area in accordance with the address information about the blank areas in the cluster in response to a write request; c) an address information update means for updating the address information about the blank area; d) an ID management means for registering an ID in each cluster; and e) a pointer creating means.

A device like a mobile phone is connected to the system of FIG. 1 as its peripheral device.

Next, the operation of the present embodiment 1 will be described.

First, physical addresses, cluster management areas and application areas of the BGO flash memory 11 will be described with reference to FIG. 2. It is assumed here that the BGO flash memory 11 is erased to FFh, and its data is written only in the direction from 1 to 0.

Figure 2:
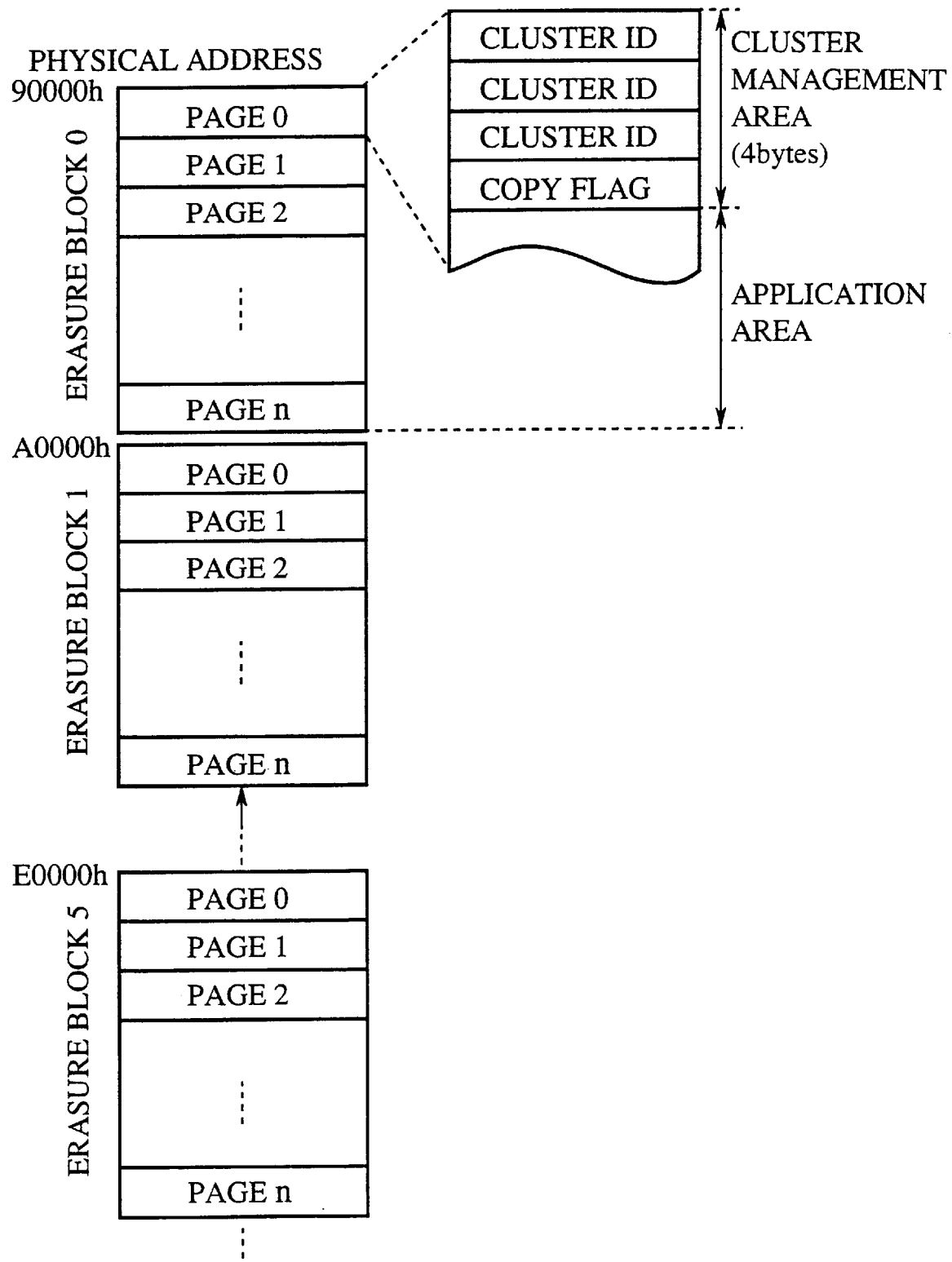
FIG. 2 is a diagram showing an internal structure and a cluster management area of a BGO flash memory.

In FIG. 2, each cluster, that is, an erasure block, consists of n pages, and a 4-byte cluster management area is provided at the top of page 0 of each cluster.

The cluster management area consists of three cluster IDs and one copy flag. The three cluster IDs store the same value, and are made valid when two or more cluster IDs agree with each other. Since the cluster IDs in a cluster management area each consist of one byte, they can represent 254 clusters except for 00h and FFh. Each cluster is allotted a unique cluster ID consisting of the same three cluster IDs, and one or more clusters (that is, their cluster IDs) are assigned to an application.

Since FFh represents the initial state, it serves as a blank cluster ID pointing to a writable cluster, and 00h serves as an invalid cluster ID because it indicates an unwritable cluster.

Following the three cluster IDs, the 1-byte copy flag is reserved, and the remaining area of each cluster (erasure block) constitutes an application area reserved for free use by the application allotted to the cluster.

Each application is allotted its own application ID instead of physical addresses in which their data are stored under the restriction that each application ID must be uniquely assigned to a single application used by the system.

In making an access to the BGO flash memory 11, the application searches for one of the cluster IDs coincident with its own application ID, searches for the physical address corresponding to the cluster, and computes the write or read address of its data.

Since the BGO flash memory 11 must erase its data on a block by block basis (that is, cluster by cluster basis), it must erase, even when only a particular area of the block must be erased, and it must save the required data before erasing the block.

However, considering the cost, purpose of employing the BGO flash memory 11 and reliability of the data, it is not preferable to save the required data in the RAM 13. Thus, the data must be saved in the BGO flash memory 11 rather than in the RAM 13, which requires a blank area on the BGO flash memory 11 in which no data is written. The process of acquiring a blank area to save the required data, and then erasing the original block is called a data reclaim which is unavoidable in the BGO flash memory 11.

Figure 3:
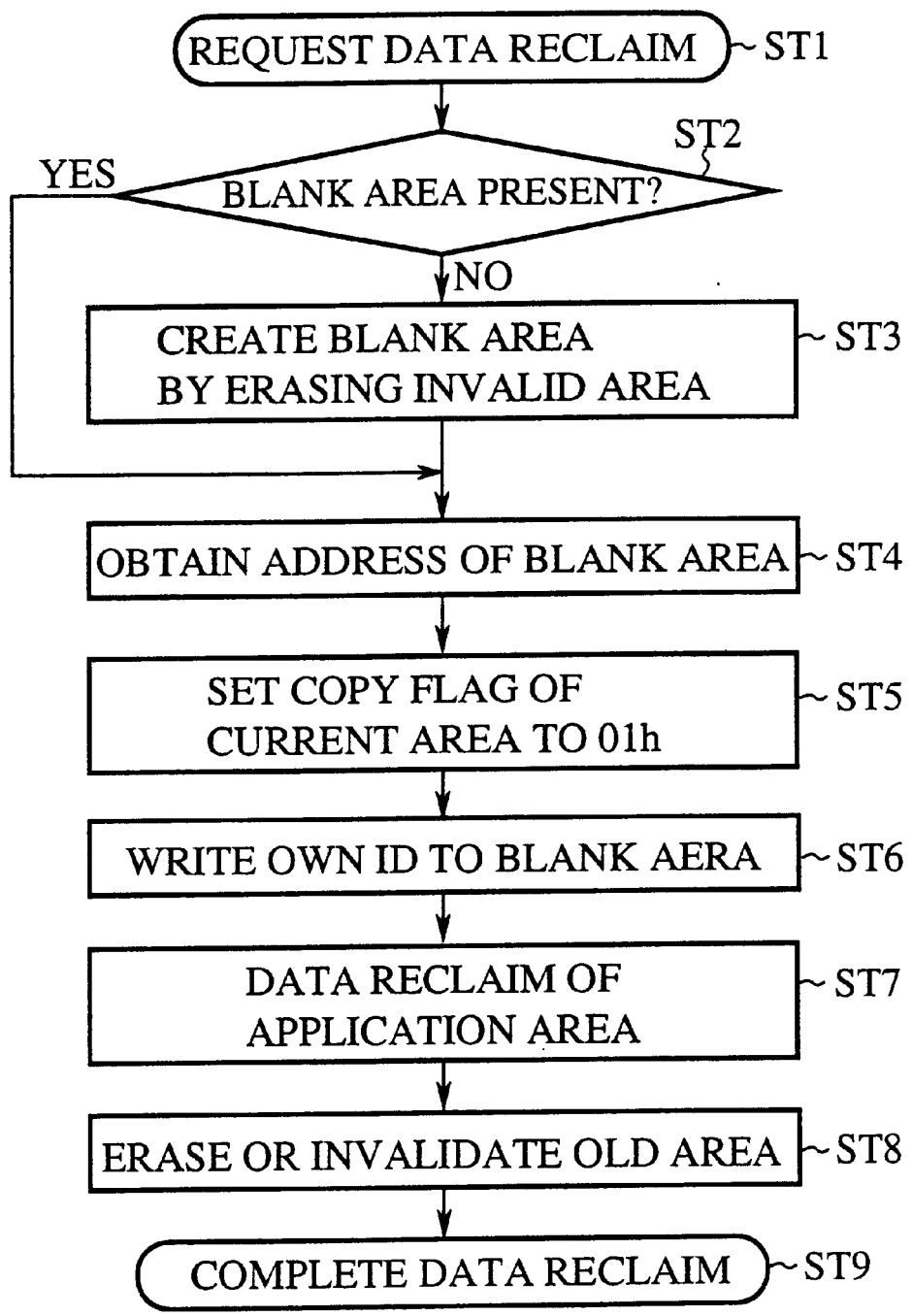
FIG. 3 is a flowchart illustrating a data reclaim procedure.
Figure 4:
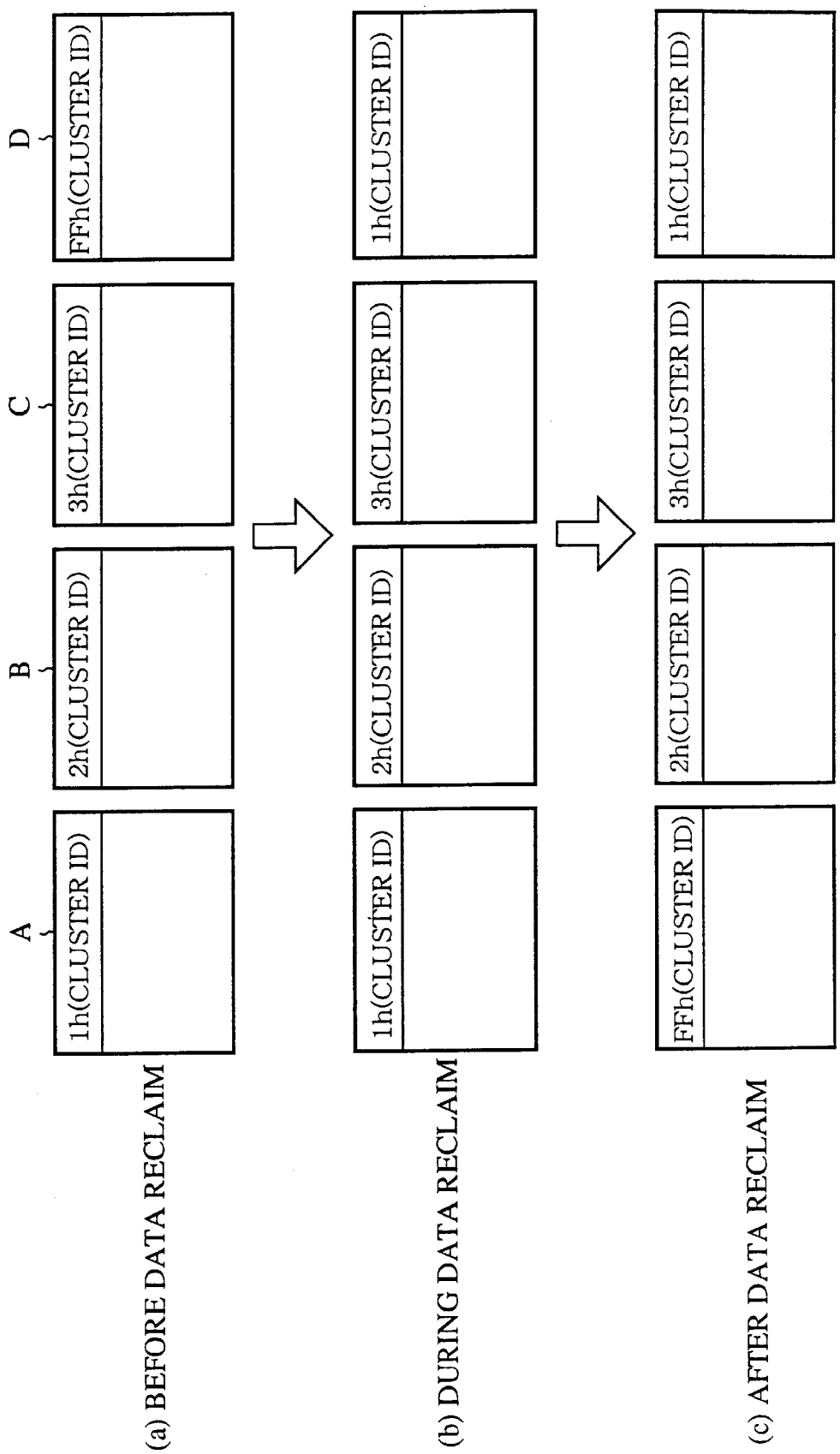
FIG. 4 is a diagram illustrating assignment of cluster IDs during the data reclaim.

The data reclaim procedure will now be described with reference to FIGS. 3 and 4.

When the data reclaim of a cluster A becomes necessary at step ST1, for example, the application of the cluster A searches the BGO flash memory 11 for a blank area at step ST2. When the cluster D is a blank area as illustrated in FIG. 4(a), the application acquires the address of that blank area (cluster D) at step ST4 referring to its cluster ID.

If no blank area is present, the application erases an invalid cluster to create a blank area at step ST3, and acquires the address of that blank area at step ST4.

Obtaining the address of the blank area, the application of the cluster A changes the copy flag of the current cluster A to 01h at step ST5, and registers its own application ID (01h) into the blank area (cluster D) at step ST6 as illustrated in FIG. 4(b).

Registering its own application ID in the blank area (cluster D), the application of the cluster A copies its required data to the blank area at step ST7, and completes through steps ST8 and ST9 the data reclaim procedure by erasing or invalidating the old area, cluster A, after completing the copy as shown in FIG. 4(c).

When a fault such as a power outage takes place during the data reclaim, it is likely that two or more clusters will have the same cluster ID. In such a case, the duplicate clusters must be removed at system power-up because of the restriction that the duplication of the same cluster ID Must be eliminated.

Thus, the duplicate clusters are checked at the start of the system so that the duplicate cluster, with the copy flag of FFh, is deleted. This is because when the system fault takes place before the erasure or invalidation of the data, it is difficult to ascertain to what point the data reclaim has reached. Thus, the copy destination whose copy flag is maintained at FFh is deleted after deciding the copy source whose copy flag has been changed (see step ST5 of FIG. 3). This is because maintaining the copy source makes it possible to avoid the problem of data corruption which makes writing impossible.

If a device error (write error) takes place while writing data, it is necessary to rewrite the data. To achieve this, two or more blank areas are prepared.

In this case, the ID of the cluster in which the write error takes place is changed into an invalid cluster ID, and the reclaim processing is carried out by acquiring a new blank cluster. Since flash erasing of the invalid cluster can sometimes restore its original normal state, the invalid cluster is flash erased when power is turned on, or the system is not busy. This is effective for an unexpected error of the device.

Figure 5:
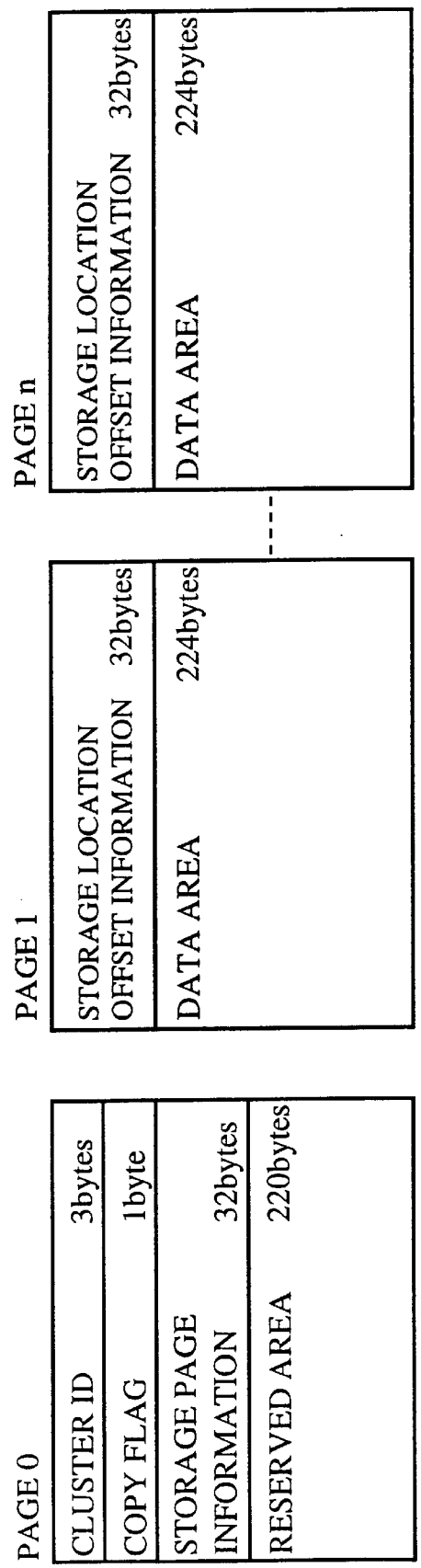
FIG. 5 is a diagram illustrating an internal data structure in an application.

FIG. 5 is a diagram illustrating a structure of the internal data of an application.

The cluster consists of n sectors (n pages). Page 0 includes a header, and page 1 and subsequent pages include data areas. The first four bytes of page 0 are assigned to the cluster IDs and the copy flag, and the subsequent 32 bytes are used for recording storage page information. Lengths of data to be written are predetermined by the system, and are invariable in the system.

Figure 6:
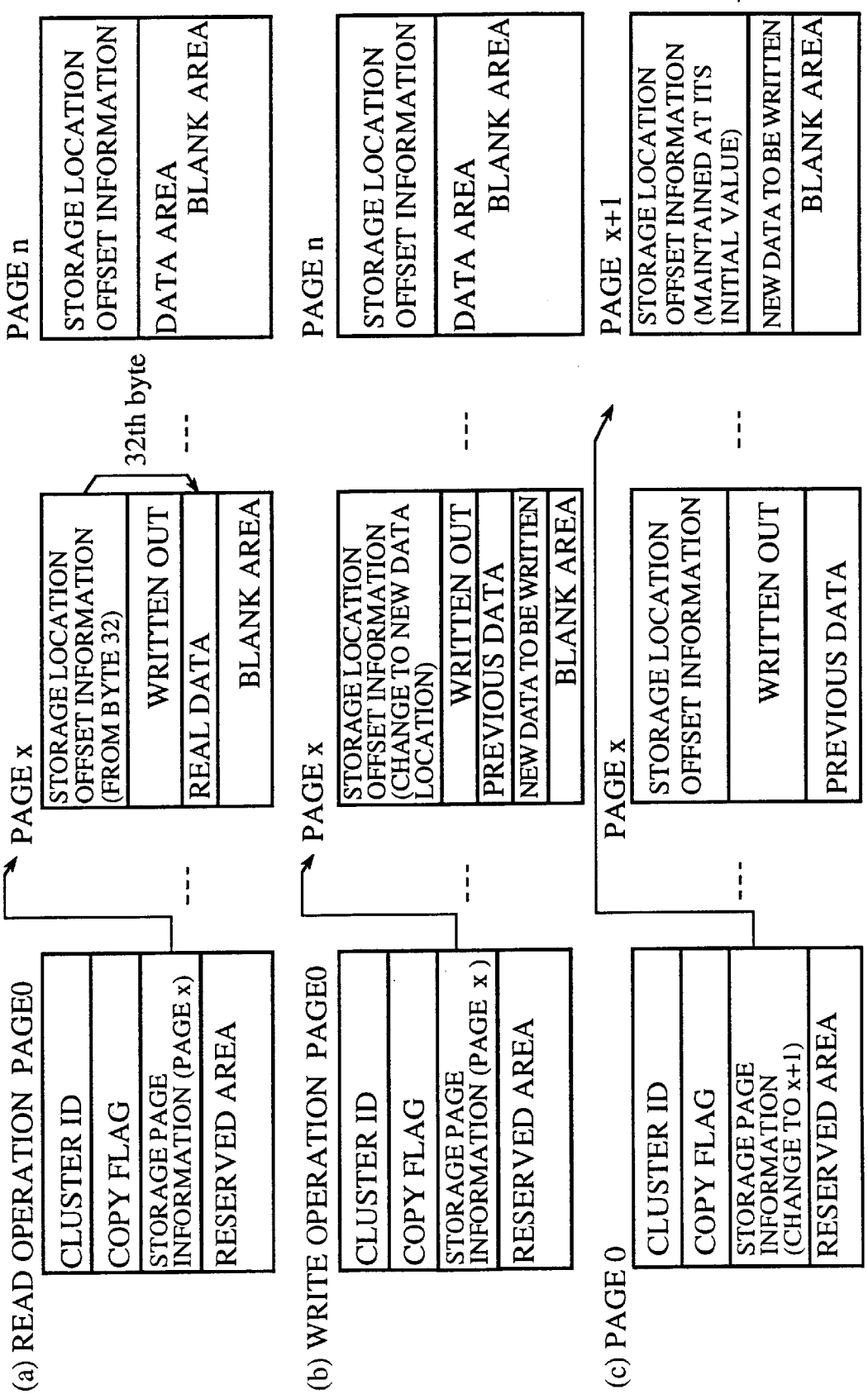
FIG. 6 is a diagram illustrating data read and data write procedures.

FIG. 6(a) illustrates a procedure for reading data. The application, referring to the cluster ID, reads the storage page information, and obtains the page number, that is, the sector in which the data is stored. Recognizing that the data is stored in page x, for example, the application refers to storage location offset information recorded at the initial position of the page x to learn the location of the data in that page.

Here, the storage page information and the storage location offset information are each represented using a bit table of 256 bits or 32 bytes. The bit values are changed from 1 to 0 each time the sector changes its used state.

For the storage page information, when the data is stored from page 1 to page x, for example, the bit values of the storage page information are changed from 1 to 0 from the LSB to x bit so that the total number of 0s corresponds to the stored pages.

Figure 7:
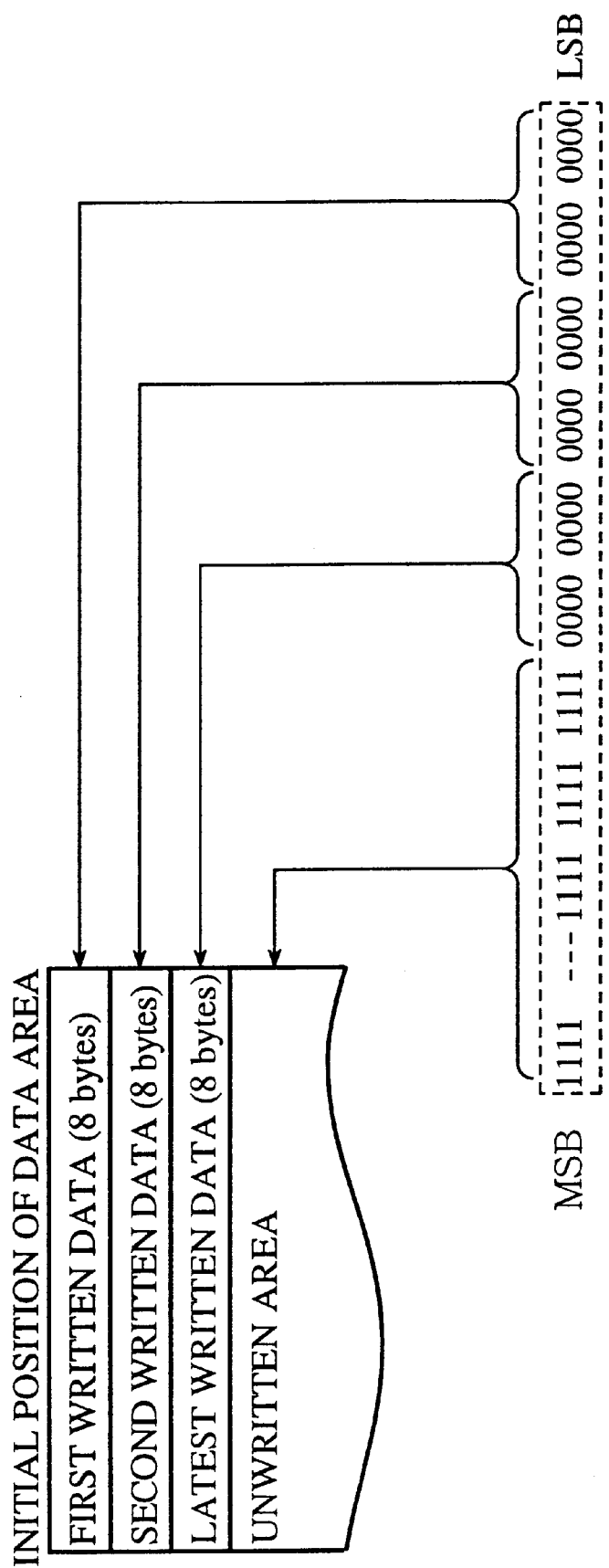
FIG. 7 is a diagram showing relationships between storage location offset information and data.

On the other hand, for the storage location offset information, each byte in the data area corresponds to one bit of the storage location offset information as shown in FIG. 7. Thus, every time the data is stored sequentially from the first byte of the data area, one bit of the storage location offset information is sequentially changed from 1 to 0 beginning from the LSB.

With such a structure, the application can recognize, from the total number of 0 bits in the storage page information, the page number in which the data is stored, and then obtain the location, where the data is stored in the data area from its initial position, by sequentially checking the bit values from the LSB of the storage location offset information. For example, if the bit values from the LSB to 24-th bit of the storage location offset information are 0, the application recognizes that the data is stored from the initial position to the 24-th byte of the data area.

Recognizing the final location of the data, the application reads the data from the first address to the final location.

Figure 8:
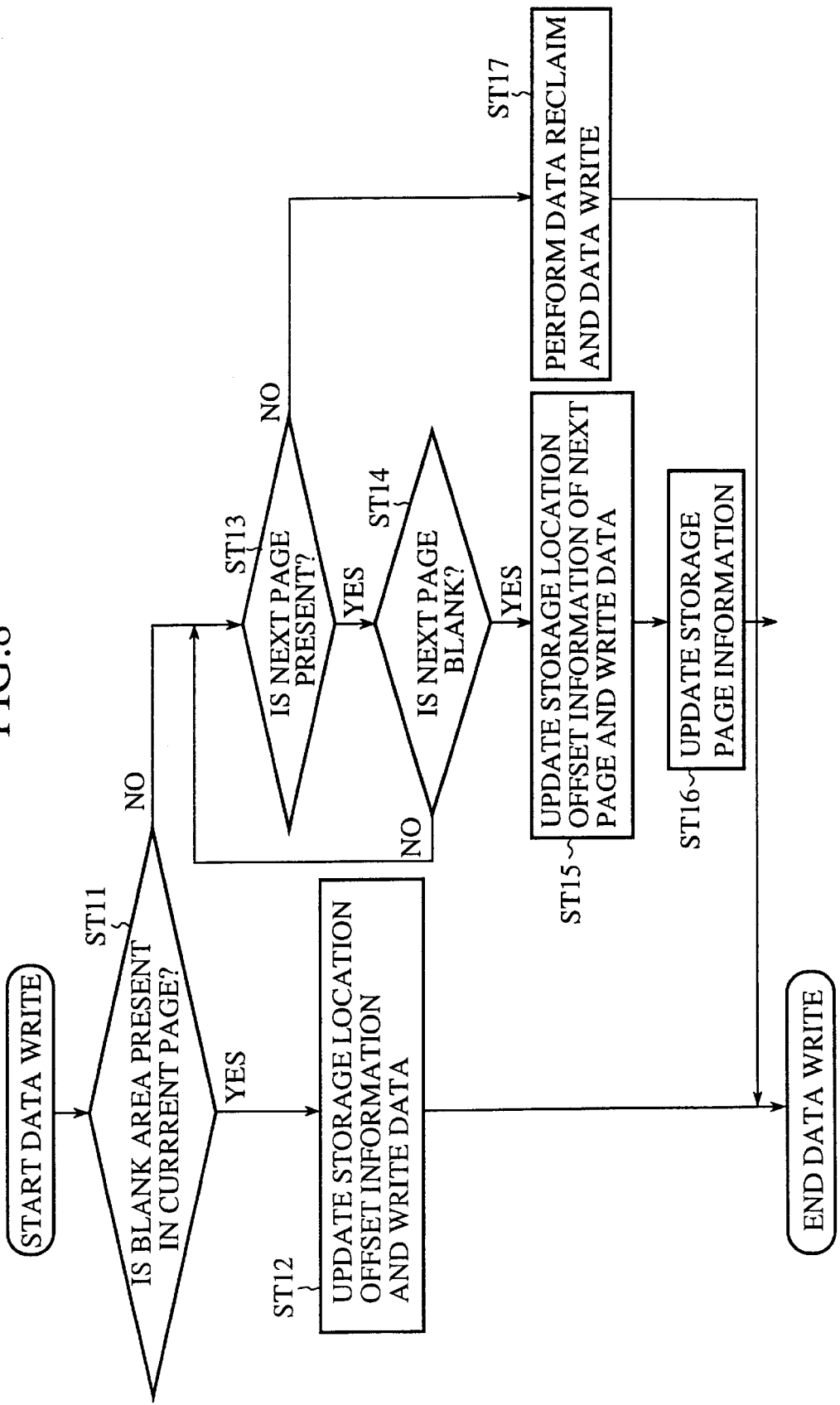
FIG. 8 is a flowchart illustrating a data write procedure.

FIG. 8 is a flowchart illustrating a data write procedure.

Recognizing the final location of the data through the same procedure as in the data read, the application checks whether or not any blank area (unused area) is present in that page at step ST11. When any blank area is present, the application carries out the requested data write from the location next to the final position of the previously stored data, and updates the storage location offset information at step ST12. Then, the bit, which corresponds to the location next to the final position of the previously stored data, and subsequent bits are changed from 1 to 0.

On the other hand, when a blank area is not present in the current page, the application checks whether the next page is present in that cluster at step ST13. When the next page is present, referring to the storage location offset information of the next page, the application checks whether the next page is blank or not at step ST14. This is performed because some incomplete data due to a power outage or the like which occurs while writing the data may remain in the next page, and the incomplete data will prevent the new data from being written.

When the next page is blank, the application carries out the requested data write from the initial position of the data area, and updates the storage location offset information at step ST15. Then, it updates the storage page information at step ST16, that is, it changes the bit corresponding to the next page from 1 to 0.

When the next page is not blank, the application checks whether the next page plus one is blank or not. If the next page is not present, the application performs the above-described data reclaim at step ST17, and carries out the requested data write from the initial position of the data area in the first page of the unused cluster obtained by the data reclaim.

As describe above, the present embodiment 1 is configured such that when the application receives the data write request, it refers to the address information of a blank area, and writes data to the blank area. This makes it possible for the application to write data without flash erasing the cluster including any blank area, thereby offering an advantage of being able to increase the number of rewriting operations the BGO flash memory 11 can perform.

Embodiment 2

The foregoing embodiment 1 writes the latest data immediately after the previously written data when any blank area is present in the current page. In other words, the foregoing embodiment 1 reserves in the current page an area for storing a plurality of data, and validates only the latest data which is finally stored. However, this is not essential. For example, as shown in FIG. 9, each sector (page) can include a plurality data blocks so that the application can write data into blank data blocks referring to used state flags (intra-page active block flag and intra-page used-up block flag) which are recorded in the header of that sector (page) to indicate the used state of the data blocks.

FIG. 9 is a diagram illustrating a structure of the internal data in the application.

Each page of the cluster comprises a page header and a plurality of data blocks. The page header includes a cluster ID and a copy flag at its initial position, followed by a 3-byte intra-page active flag and a 3-byte intra-page used-up flag. Each data block includes a 1-byte data number, a 1-byte data area used state information and an 8-byte data area.

Figure 10:
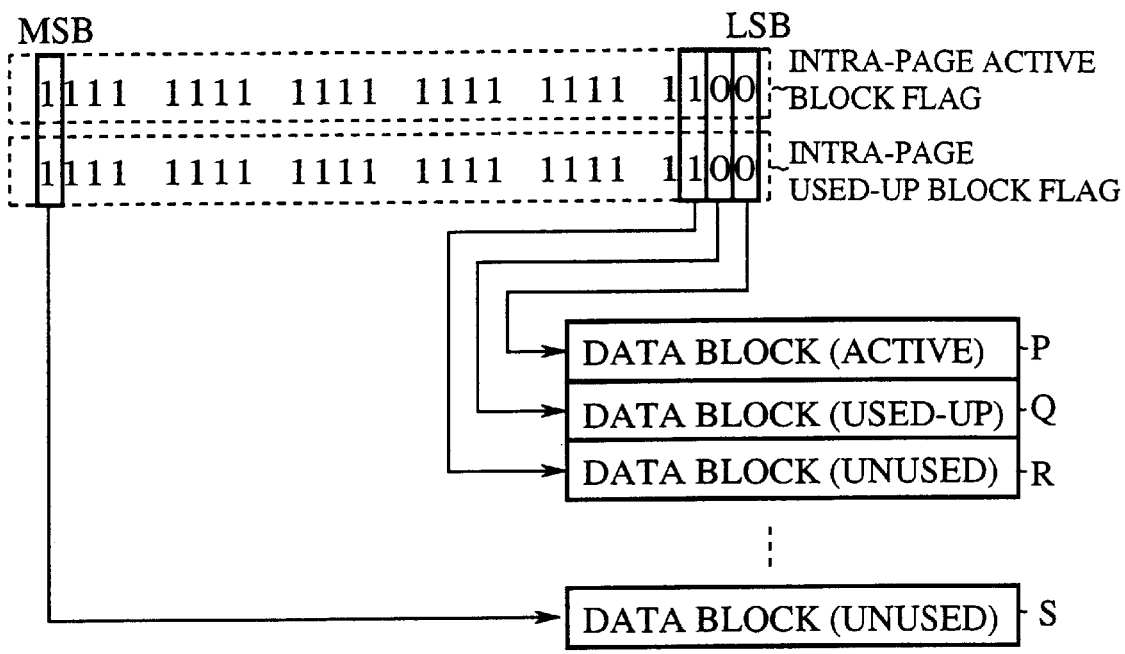
FIG. 10 is a diagram illustrating relationships between data blocks and intra-page active block flags and intra-page used-up block flags.

FIG. 10 is a diagram illustrating relationships between the data blocks and the intra-page active block flag and intra-page used-up flag. The active block can be obtained by the exclusive OR operation between the intra-page active block flag and the intra-page used-up flag, followed by searching for the data block associated with the resultant value 1 (data block P in the example of FIG. 10).

The data read or write is carried out by designating one of the data IDs, in which 00h is made a used-up data ID, and FFh is made a blank ID. The remaining 254 data IDs are available, and the data length assigned to these IDs can be from one to eight bytes. The data length cannot be varied in the program.

A pointer creating means of the application establishes, in the RAM 13, a data retrieval pointer that points to the location of a data block storing the data. The pointer records the page number and the block number of the data area. When their contents are eliminated from the RAM 13 because the power is turned off or the like, they are restored to the RAM 13 by searching all the data areas at power-up or the like.

Figure 11:
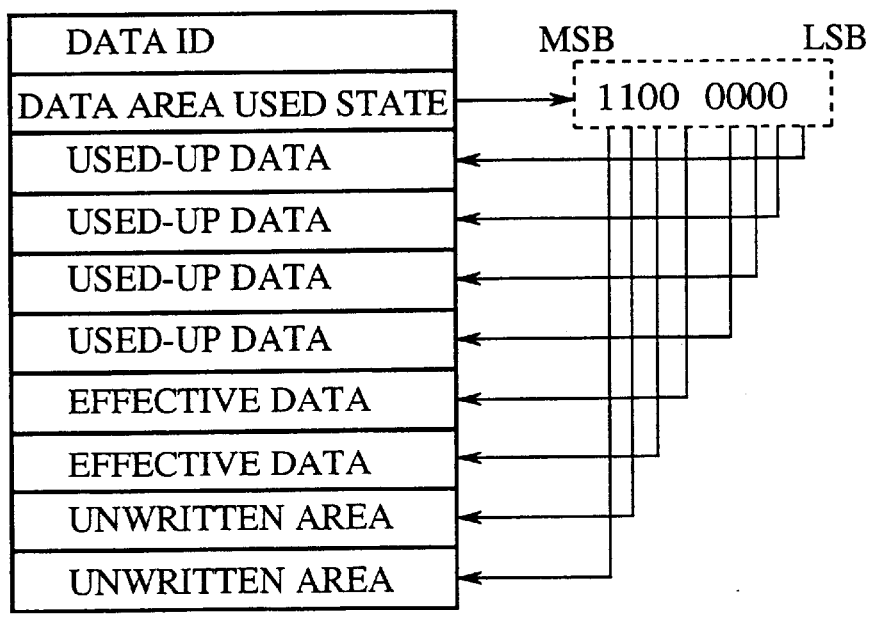
FIG. 11 is a diagram illustrating relationships between a data area used state and data areas.

When reading data, the application searches the data block pointed to by the data ID, and carries out the data read referring to the data area used state (see, FIG. 11).

The eight bits of the data area used state, which correspond to the eight bytes of data area, indicates a used-up location by bit 0.

Figure 12:
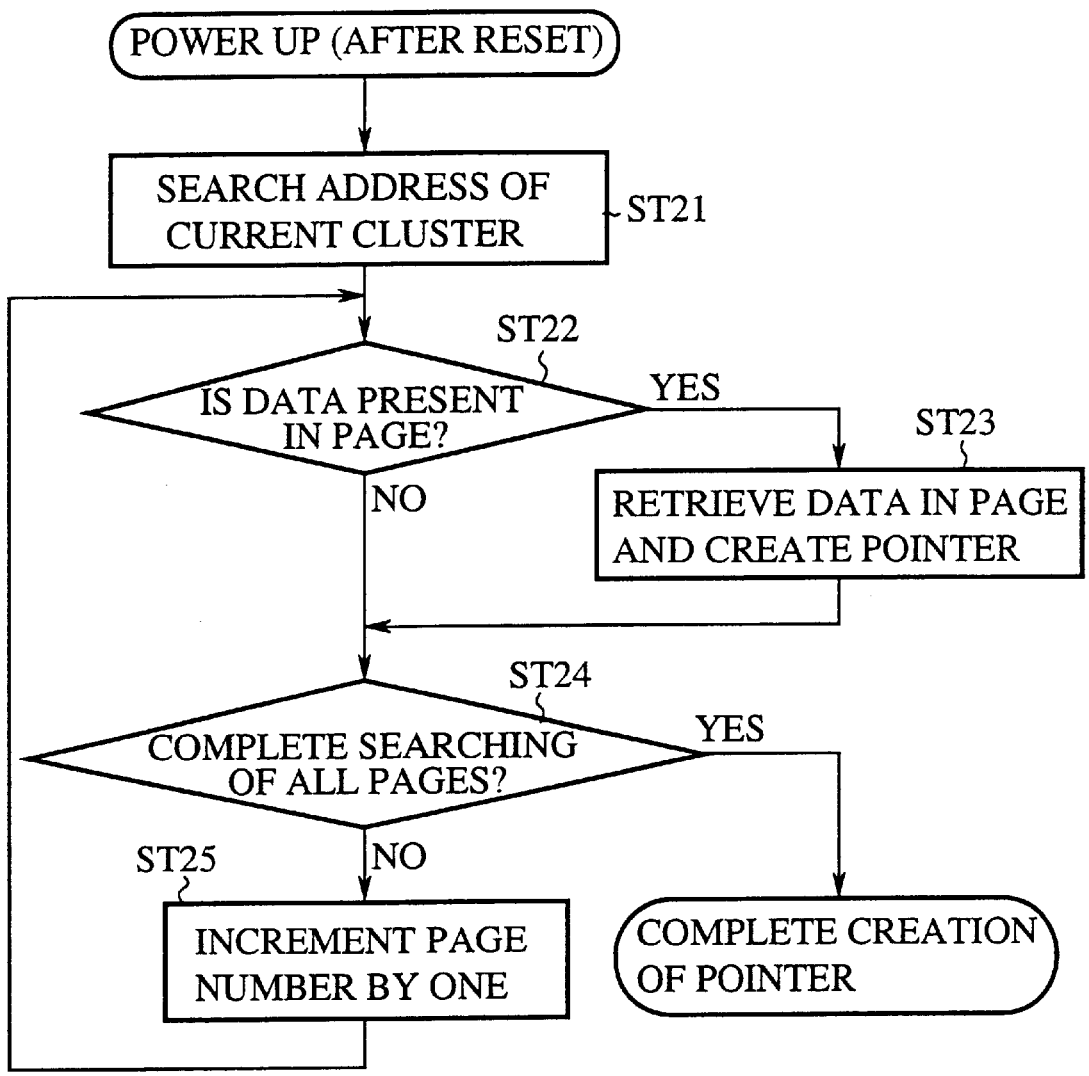
FIG. 12 is a flowchart illustrating an initial routine of creating a data retrieval pointer.

FIG. 12 is a flowchart illustrating an initial routine for restoring the data search pointers to the RAM 13.

In the initial routine at power-up or the like, the application searches for the address of a cluster being used, and when a data area is present in each page, it updates the data in the pointer through steps ST21–23.

The data currently used in the page is obtained by referring to the intra-page active block flags and intra-page used-up block flags in the page headers as in the data read, because there are too much data in the blocks.

Repeating the foregoing procedure at steps ST24 and ST25 up to the last page, the pointer construction is completed.

Figure 13:
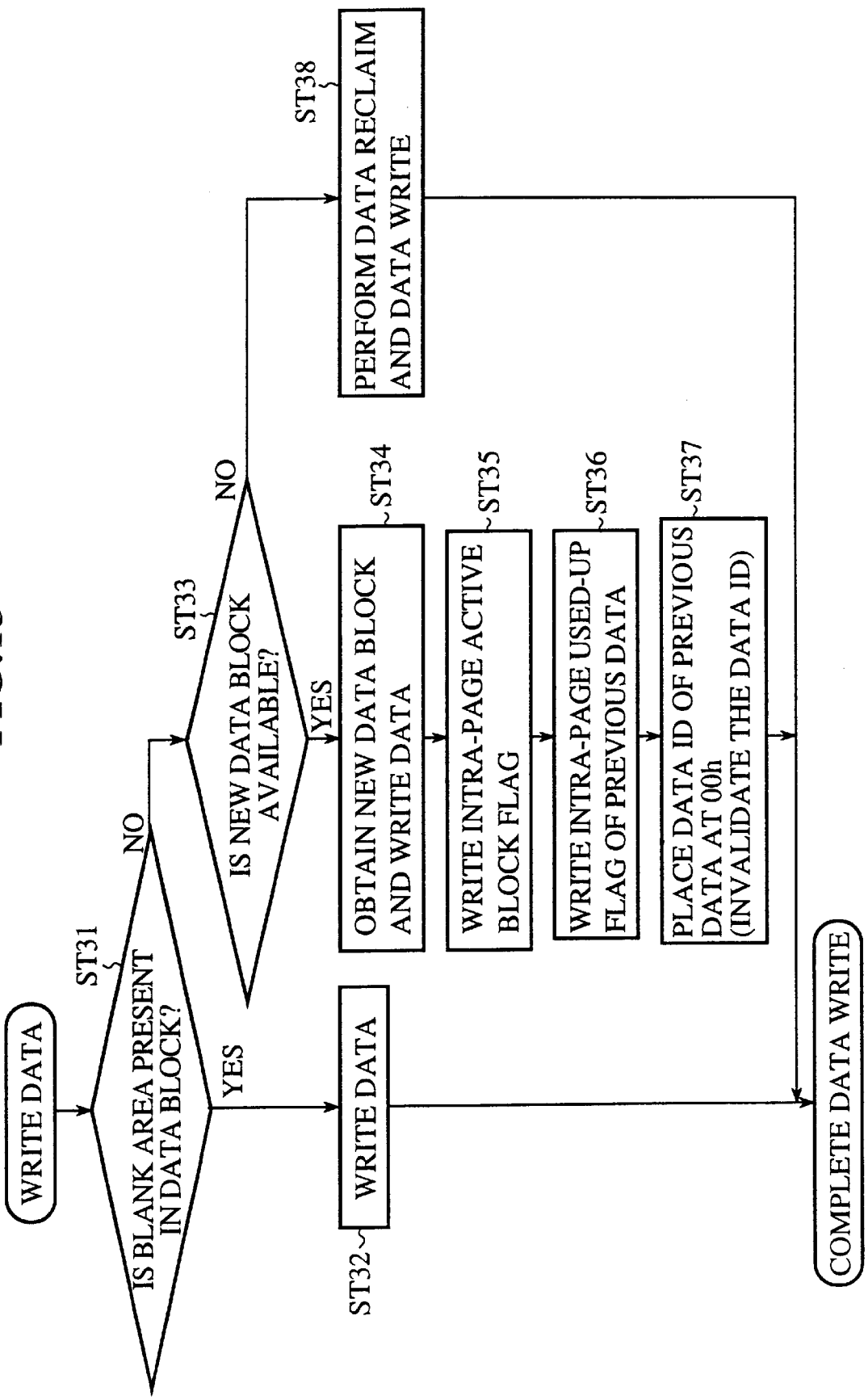
FIG. 13 is a flowchart illustrating a data write procedure.
Figure 14:
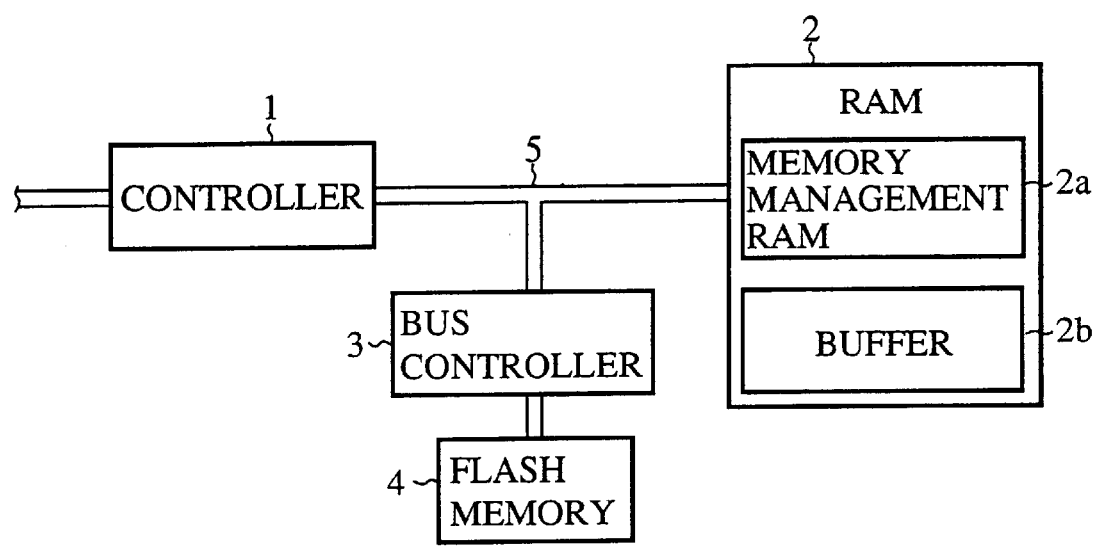
FIG. 14 is a block diagram showing a conventional semiconductor disk which stores data in a flash memory.

FIG. 13 a flowchart illustrating the data write procedure of the present embodiment 2.

First, the application searches a data block, in which its data is stored, for a blank area, and when any blank area is present in the data block, it writes data into the blank area through steps ST31 and ST32.

On the other hand, when no blank area is present in the data block, the application makes a decision as to whether or not it can obtain a new data block at step ST33. When the application can obtain a new data block, it writes its data number and data into the new data block at step ST34, and writes the intra-page active block flag at step ST35. In addition, the application writes the intra-page used-up block flag of the previous data at step ST36, and then invalidates the data block ID of the previous data at step ST37. When the application cannot obtain any new data block, it carries out the data reclaim and the data write at step ST38.

As described above, the present embodiment 2 is configured such that it writes data into blank areas of the data block by referring to the used state flags such as the intra-page active block flag and the intra-page used-up flag indicating the used state of the data blocks in the header of each sector including a plurality of data blocks. This offers an advantage of being able to rewrite the maximum of 254 types of data on a one to eight byte basis.

Embodiment 3

Although the foregoing embodiments 1 and 2 write data into the BGO flash memory 11, this is not essential. The present invention can also be applied to any type of a flash memory.

What is claimed is:

1. A flash memory comprising:

address information storing means for storing address information about blank areas located in a cluster, wherein the cluster includes a plurality of sectors;

data write means for writing, in response to a write request, data into at least one of said blank areas by referring to the address information stored in said address information storing means; and address information update means for updating the address information associated with said at least one of said blank areas to which the data is written, after said data write means completes writing of the data, wherein when said cluster does not include any blank area, said data write means writes the data into another unused cluster, and carries out flash erasing of said cluster without any blank area.

2. The flash memory according to claim 1, further comprising at least one unused cluster in addition to clusters that an application can use.

3. The flash memory according to claim 1, wherein, if a write error takes place during writing data into said blank area of the cluster or into said another unused cluster, said data write means writes data into still another cluster, and carries out flash erasing of the cluster in which the write error takes place.

4. The flash memory according to claim 3, further comprising two or more unused clusters in addition to clusters that an application can use.

5. The flash memory according to claim 1, further comprising ID management means for registering a unique ID for each of the clusters that an application uses, and for registering IDs for unused clusters indicating that the unused clusters are available.

6. The flash memory according to claim 5, wherein, if a write error of the data takes place, said ID management means registers an ID indicating that the cluster in which the write error takes place is unwritable.

7. The flash memory according to claim 6, further comprising three or more ID recording areas for recording a same ID in a header of each cluster.

8. The flash memory according to claim 1, wherein in a header of each cluster said address information storing means comprises a bit table for indicating a used state of a memory, as the address information about said blank areas.

9. The flash memory according to claim 8, wherein said data write means writes the data contiguous to previously written data without any blank space therebetween.

10. The flash memory according to claim 1, wherein each of said sectors includes a plurality of data blocks, and said data write means writes the data into a blank area of one of said data blocks by referring to a used state flag which is recorded in a header of each of said sectors, said used state flag indicating a used state of said data blocks.

11. The flash memory according to claim 10, wherein, when said one of said data blocks does not include any blank area, said data write means writes the data into a blank area of another data block.

12. The flash memory according to claim 11, further comprising pointer creating means for creating, in a volatile memory, pointers for indicating locations of said data blocks storing the data.

* * * * *